United States Patent [19]

Ito

[11] Patent Number: 5,761,674
[45] Date of Patent: Jun. 2, 1998

[54] INTEGRATED CONSTRUCTION PROJECT INFORMATION MANAGEMENT SYSTEM

[75] Inventor: Kenji Ito, Tokyo, Japan

[73] Assignee: Shimizu Construction Co., Ltd., Tokyo, Japan

[21] Appl. No.: 917,863

[22] Filed: Aug. 27, 1997

Related U.S. Application Data

[63] Continuation of Ser. No. 669,702, Jun. 24, 1996, abandoned, which is a continuation of Ser. No. 882,120, May 13, 1992, abandoned.

[30] Foreign Application Priority Data

May 17, 1991 [JP] Japan ................................ 3-112866

[51] Int. Cl.$^6$ ........................................................ G06F 17/30
[52] U.S. Cl. .............................. 707/104; 707/103; 345/357
[58] Field of Search ..................................... 707/103, 104; 345/357

[56] References Cited

U.S. PATENT DOCUMENTS

| | | | |
|---|---|---|---|
| 4,275,449 | 6/1981 | Aish | 364/512 |
| 4,370,707 | 1/1983 | Phillips et al. | 395/600 |
| 4,700,318 | 10/1987 | Ockman | 395/131 |
| 4,875,162 | 10/1989 | Ferriter et al. | 364/401 |
| 4,885,694 | 12/1989 | Pray et al. | 364/464.01 |
| 4,964,060 | 10/1990 | Hartsog | 364/512 |
| 5,016,170 | 5/1991 | Pollalis et al. | 364/401 |
| 5,021,976 | 6/1991 | Wexelblat et al. | 395/159 |
| 5,127,099 | 6/1992 | Zifferer et al. | 395/725 |
| 5,189,606 | 2/1993 | Burns et al. | 364/401 |
| 5,278,946 | 1/1994 | Shimada et al. | 395/615 |
| 5,303,144 | 4/1994 | Kawashima et al. | 364/401 |
| 5,303,147 | 4/1994 | Oba et al. | 364/402 |
| 5,355,317 | 10/1994 | Talbott et al. | 364/468 |
| 5,357,440 | 10/1994 | Talbott et al. | 364/512 |
| 5,359,523 | 10/1994 | Talbott et al. | 364/468 |
| 5,655,118 | 8/1997 | Heindel et al. | 707/103 |
| 5,689,705 | 11/1997 | Fino et al. | 707/104 |

OTHER PUBLICATIONS

Coutaz, "The Construction of User Interfaces and the Object Paradigm", Proc. of ECOOP Jun. 1987, pp. 135–144.
Shilling et al., "Three Steps to Views: Extending the Object-Oriented Paradigm", OOPSLA Oct. 1989 Proceedings, pp. 353–361.
Gilbert, "Supporting user views", Computer Standards & Interfaces, v. 13 (Jan. 1991), pp. 293–296.
Deux, et al., "The Story of O2", IEEE Transactions on Knowledge and Data Engineering, v. 2, n. 1, pp. 91–108, Mar. 1990.
Kim et al., "Schema Versions and Views in Object–Oriented Databases", Proc. of IPSJ Int'l Conf., pp. 277–284, Jan. 1990.
Heiler et al., "Views, Data Abstraction, and Inheritance in the FUGUE Data Model", 2nd Int'l Workshop on Object Oriented Database Systems, pp. 225–241, Sep. 1988.
Claiborne, "Primavera Systems, Inc.: Primavera Project Planner 4.1", PC Week, v. 8, n. 13, p. 98(2), Apr. 1, 1991.

Primary Examiner—Joseph R. Burwell
Attorney, Agent, or Firm—Armstrong, Westerman, Hattori, McLeland & Naughton

[57] ABSTRACT

An integrated construction project information management system has a project model constructed by combining a product model that defines a product with the use of physical elements and functional elements; and a process model that defines activities related to the product, the process model having elements which are described as hierarchical objects in the form of views arranged along a flow of productive activities. The system further has interfaces between the project model on the one hand, and other systems and a database on the other, and a user interface. The object includes a data object that simply has data; a scope view object that contains a function which is to be seen next; an evaluate view object that evaluates another object; and a create view object that can create a new object. The process model has distinct pieces of information necessary for execution of the activities, together with an information reference method for fetching necessary information from the data in the product model, and applications actually related to the activities, which are embedded in the process model in the form of values of slots or data items.

8 Claims, 15 Drawing Sheets

Please Select Your Occupation

PROJECT MANAGER
SALES PERSON
CHIEF DESIGNER
ARCHITECT
STRUCTURAL ENGINEER
MECHANICAL ENGINEER
ELECTRICAL ENGINEER
ESTIMATOR

OK    Cancel

FIG. 6(b)

General Description of Building

| | | |
|---|---|---|
| Usage of Building | | Office Building |
| Location | | PALO ALTO, California |
| Client | | American Research Inc. |
| Structure | Under Ground | SRC |
| | Super Structure | RC |
| | Penthouse | RC |
| Number of floor | Under Ground | 1 |
| | Super Structure | 4 |
| | Penthouse | 1 |
| Ground Condition | | Good |

General Description of Floor

| | |
|---|---|
| Floor Name | 2 |
| Usage of Floor | Office |
| Area of Floor | 1400 square ft. |
| Structure | RC |

General Description of Room

| | | |
|---|---|---|
| Consisted_by | 2 Exterior Walls | Material RC, Thickness 10.0 |
| | 2 Interior Walls | Material RC, Thickness 8.0 |
| | 4 Columns | Material RC, Size 30.0x30.0 |
| | 4 Girders | Material RC, Size 20.0x30.0 |
| | 1 Slab | Material RC, Thickness 12.0 |
| | 2 Windows | Width 40.0, Height 40.0 |
| | 1 Door | Width 120.0 Height 80.0 |

(Unit inch)

INTEGRATED CONSTRUCTION PROJECT INFORMATION MANAGEMENT SYSTEM

This application is a continuation of application Ser. No. 08/669,702 filed Jun. 24, 1996, now abandoned, which is a continuation of application Ser. No. 07/882,120 filed May 13, 1992, now abandoned.

BACKGROUND OF THE INVENTION

The present invention generally relates to an integrated construction project information management system having as its kernel a project model which is constructed by combining together a product model and a process model. Such product model and process model are comprised of objects that are arranged in a hierarchical structure.

A significantly large amount of information is created and used during a life-cycle of a construction project (i.e., from a planning stage through design and construction stages to facility management. In order to accomplish such a construction project, each person in charge shares the project data with others, and keeps such data for his own use, and on the basis of his allotted share of the work. However, the project activities are interrelated with each other in a complex manner so that it is very difficult for the persons in charge to have information in common with each other. Such complexity is due to the fact that the project data is stored, retrieved, computed and updated as the project progresses from the viewpoint of each person in charge with respect to each particular piece of information.

In order to improve building production systems, it is essential to realize innovations on building production technology (i.e., achievement of industrialization, conglomeration, automated production, etc.); and it is also necessary to construct a system that: (1) manages information related to a production, such as that described above, in conformance with the scale and form of each particular construction project; and (2) aids in design, planning and management in an integrated manner. The purpose of such a system is to enable information related to a building production to be managed unitarily by making use of a computer and to properly transmit production information generated at each stage of the production to the next process. Additionally, such system must deliver a building production framework based on a new functional allotment between design and construction.

Under the above-described circumstances, various computer systems (e.g., CAD system, analytical system, analytical system, simulation system, etc.) have been developed and introduced by construction firms. However, many of these systems are effective only within a very narrow application domain so that transmission of information between different domains is realized by linking together the applications in the current state of art. Accordingly, exchange of project data between persons engaged in activities in different domains cannot be accomplished in a satisfactory manner based on the teachings of the prior art.

SUMMARY OF THE INVENTION

It is thus an object of the present invention to make it possible to realize a unitary management of information created and used in building production, and to achieve highly-advanced or efficient building production and integration of the building production.

It is another object of the present invention to provide an integrated construction project information management system which can cope flexibly with changes in the contents of activities in a construction project and changes in the project organization and also changes in the system and yet allows a product model concerning a building to be kept independent.

Accordingly, the present invention provides an integrated construction project information management system which includes a project model constructed by combining together a product model that defines a product by using physical elements and functional elements, and a process model that defines activities related to the product. Such process model includes elements which are described as hierarchical objects in the form of views arranged along the flow of productive activities; interfaces between the project model on the one hand and other systems and a database on the other; and a user interface.

In addition, the objects include a data object that simply has data, a scope view object that contains a function which is to be next seen, an evaluate view object that evaluates another object, and a create view object that can create a new object. The process model has distinct pieces of information necessary for execution of the activities, together with an information reference method for fetching necessary information from the data in the product model and applications actually related to the activities, which are embedded in the process model in the form of values of slots or data items.

In addition, the process model has a constraint view that has a value for inheriting a constraint to another view in a slot or data items; and a right of access for viewing is described by a function of a list so that it is possible to access lower-level views from a view concerned in view units. Further, an application is embedded in a slot or data items in the form of a function so that such applicant can be started by the function.

In addition, the process model has a management view for managing the entire project, and a general view for storing project information.

In view of the above described arrangement, the system of this invention comprises a project model as its kernel which is constructed by combining together a product model that defines a product and a process model that is described as a set of hierarchical objects in the form of views which are arranged along the flow of productive activities. Accordingly, the product model and the process can be kept independent of each other, and the design of the product model is facilitated. In addition, since the process model is described as a set of hierarchical objects in the form of views which are arranged along the flow of productive activities, each object can have data and various functions so that information necessary for each activity can be accessed and organically used.

Moreover, the objects include a data object that simply has data; a scope view object that contains a function which is to be next seen; an evaluate view object that evaluates another object; and a create view object that can create a new object; as well as an information reference method for fetching necessary information from the data in the product model. Further, applications actually related to the activities are embedded in the process model in the form of values of slots together with distinct pieces of information necessary for execution of the activities. It is therefore possible to construct a project model which can be widely used for productive activities in construction, and to provide a cumulative design-construction planning environment.

Additionally, the process model has a constraint view that has a value for inheriting a constraint to another view in a slot or data item, and a right to access view is described by a function of a list so that it is possible to access lower-level views from a view concerned in view units. Accordingly, a constraint can be propagated from a higher level to a lower level; and thus, delivered in the model to perform management. Further, because an application is embedded in a slot or data item in the form of a function so that it can be started by the function, it is possible for the user who enters a certain view to activate the application and see the result. In addition, since the process model has a management view for managing the entire project and a general view for storing project information, it is possible to represent even more extensive information.

These and other features of this invention will be understood upon reading of the following description along with the drawings.

BRIEF DESCRIPTION OF THE DRAWINGS

FIG. 6(b) shows a description thereof.

DETAILED DESCRIPTION OF PREFERRED EMBODIMENTS

Figure 1:
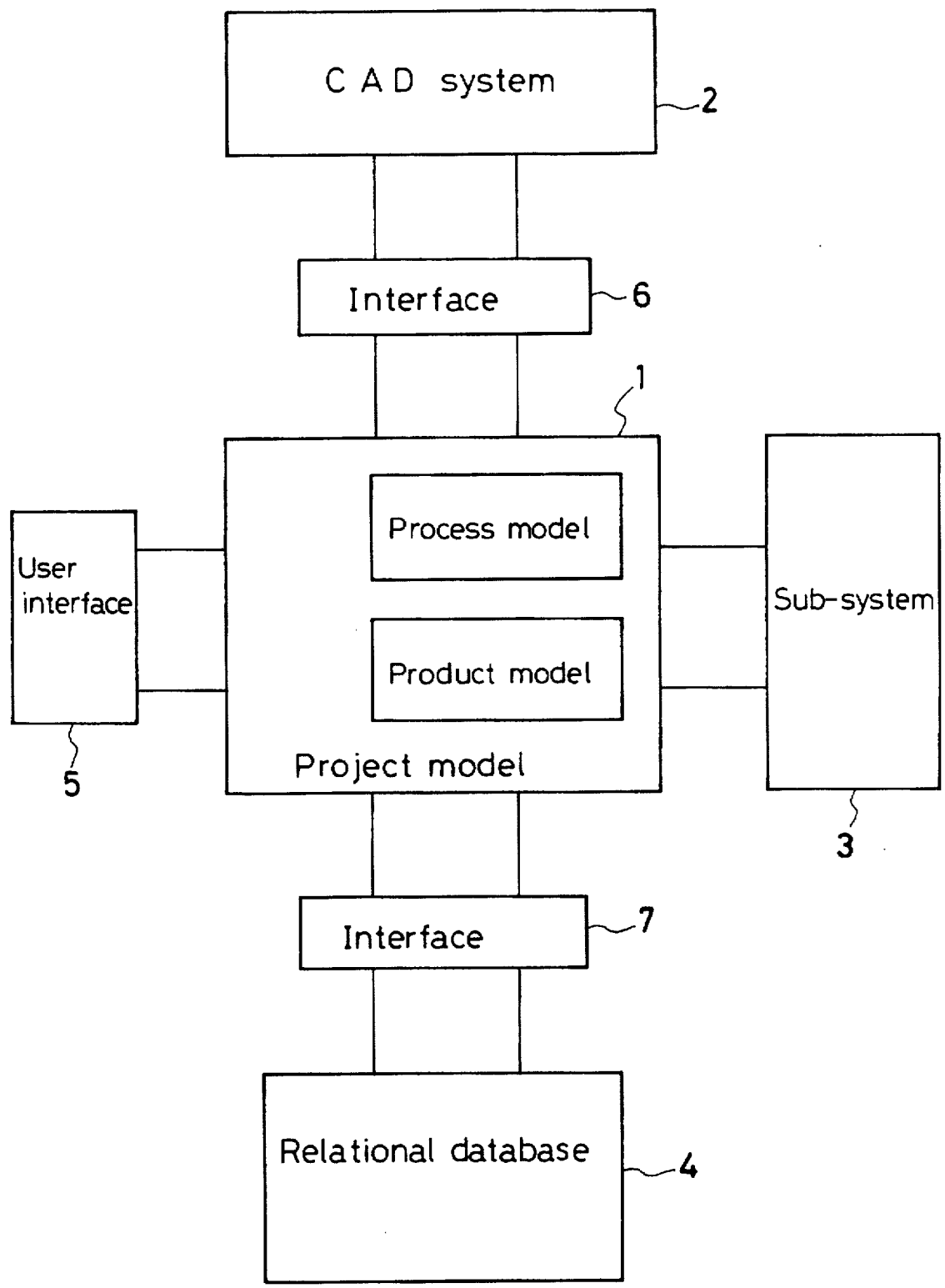
FIG. 1 shows one embodiment of the integrated construction project information management system according to the present invention.

The integrated construction project information management system of the present invention comprises, as its kernel, an object-oriented building model 1 having multiple views, as shown in FIG. 1. The object-oriented building model 1 is a project model in which one project is represented by a combination of a process model and a product model, which are comprised of objects that are grouped in a hierarchical structure.

In a typical conventional computer system, programs and data are prepared; and the programs execute various processes by using the data. In the present invention, however, the conventional concept of programs and data is replaced by such concept of objects whereby a subject of interest is defined as one object. For example, if the fact that a man eats is defined as one object, pieces of data which represent a man, the act of eating and what he eats are put together in a set of data items, which altogether is called "object". Accordingly, objects have functions of holding various data and incorporating programs.

One object has a plurality of slots or data items, and values of the slots are represented in the form of atoms, symbols or lists. For example, a character (such as, A) and a numeral (such as, 10) are represented by atoms, while a string of characters (such as, a name) is represented by a symbol or a string; and a plurality of data functions or formulas are represented by a list expressions using parentheses. For example, clients' names and addresses may be represented in the form of lists or atoms depending upon the manner of representation. Attributes depend upon the manner of holding information. Methods are defined as functional procedures, such as those which instruct the system what to do in a particular object or frame structure.

For example. "Clients 1" is a type of object, and is also called "frame", which contains information about clients' names, addresses, business activities, capital, industrial group, etc. These named items are called "slots or data items", and a value is associated with each slot. If a string of characters is entered, the value is represented by a string; whereas, if a plurality of pieces of information are entered, the value is represented by a list of expressions. A set of such data items or slots, are defined as an object, and the process is executed in units of objects. Accordingly, if items are defined and item values are given for each object, one set of objects is completed.

In the model employed in to the present invention, objects are grouped in order to clarify the respective functions. That is, objects are divided into four types: (1) a data object that simply has data, (2), a scope view object that contains a function indicating, for example, what to see next, (3) an evaluate view object that can perform evaluation defined in an expert system (e.g., by simulating another object), and (4) a create view object that can create a new object. Accordingly, when the objects are arranged in a hierarchical structure, the functional attributes can be automatically inherited from each higher level to the next lower level; and constraints can be inherited by using the functions.

The product model is prepared by defining a building as a product model with the use of physical elements (e.g., columns, girders, etc.), and functional elements (e.g., floors, rooms, etc.). The process model is prepared by analyzing each of the productive activities and defining them as a productive activity model. With such models, the present invention constructs a project model which is widely applicable to productive activities in construction without limiting the data input portion or the application domain; thereby, providing a cumulative and interrelated design-construction planning environment.

A CAD system 2 has various kinds of interface (i.e., an interface used to define columns, girders, walls, rooms, etc.); a file interface used to prepare a file for providing design information to a building model; a file interface used to prepare a file for providing design information to an expert system that evaluates construction, and so forth.

A sub-system 3 comprises some expert systems and other applications. One of the expert systems is, for example, a system that evaluates and calculates a roughly estimated construction period in accordance with the process or flow of the building production by using the latest information that can be utilized at each activity stage in the object-oriented building model 1, and capable of demanding data from the user when there is insufficient information for the estimation. This system can be independently used, and is capable of automatically using data from the objects in the process model.

Another expert system aids construction planning by using information in the object-oriented building model 1. When it is used in the construction planning view, the object-oriented building model 1 automatically fetches information from the product model; makes a sub-model for each system; and starts the system. When the system is independently used, only a sub-model can be made from the system menu.

A relational database 4 is stored with information about the finishing cost for each building element or member; information on clients, information about achievements in the past; personnel information, etc. in the form of texts. Information obtained from the relational database 4 is taken into the object-oriented building model 1 through an interface 7 so as to be used for various kinds of productive activity.

A user interface 5 controls the access to a hierarchical view according to an occupation inputted by each user.

Next, the object-oriented building model is hereinafter explained.

Figure 2:
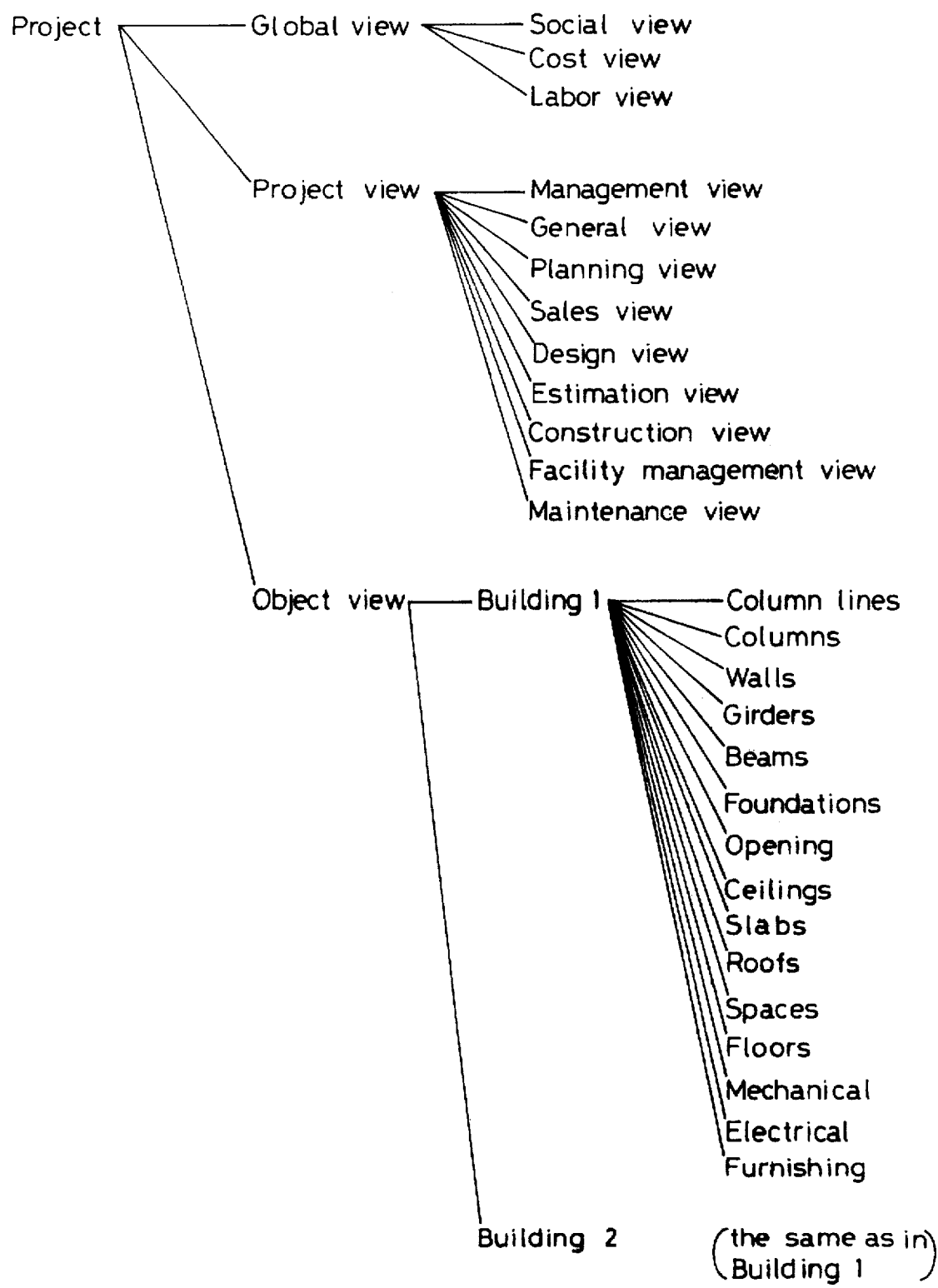
FIG. 2 shows a hierarchical structure of a project model that is employed in the present invention.

A project model is composed of a global view; a project view, which constitutes a process model; and an object view, which constitutes a product model, for each project, as shown in FIG. 2. There are cases where a plurality of buildings are constructed with one project, and there are also cases where a plurality of plans must be made for the construction of one building. For this reason, the system is arranged such that a plurality of sets of such views can be prepared.

Figure 3A:
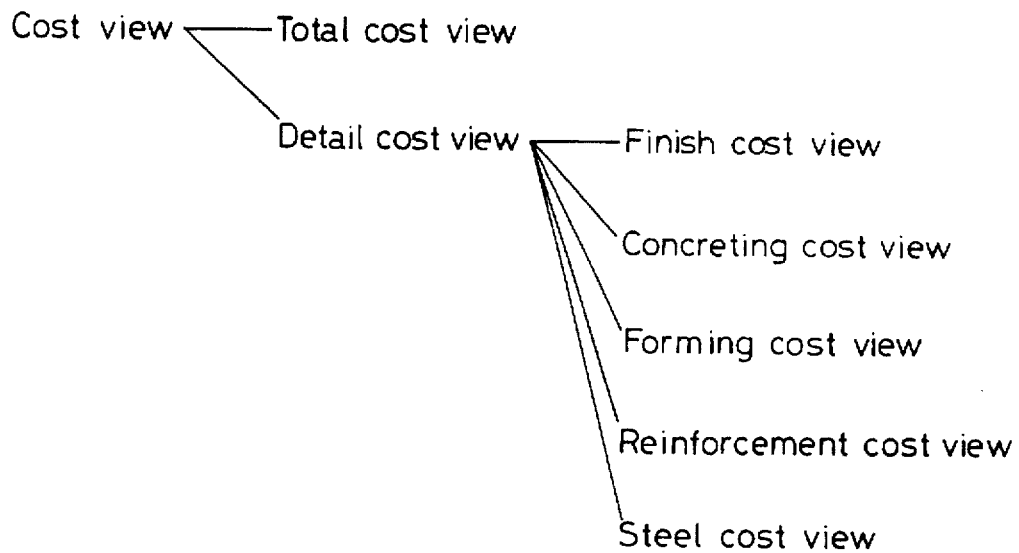
FIGS. 3(a) through 3(h) show hierarchical structures of views present under each view.
Figure 3C:
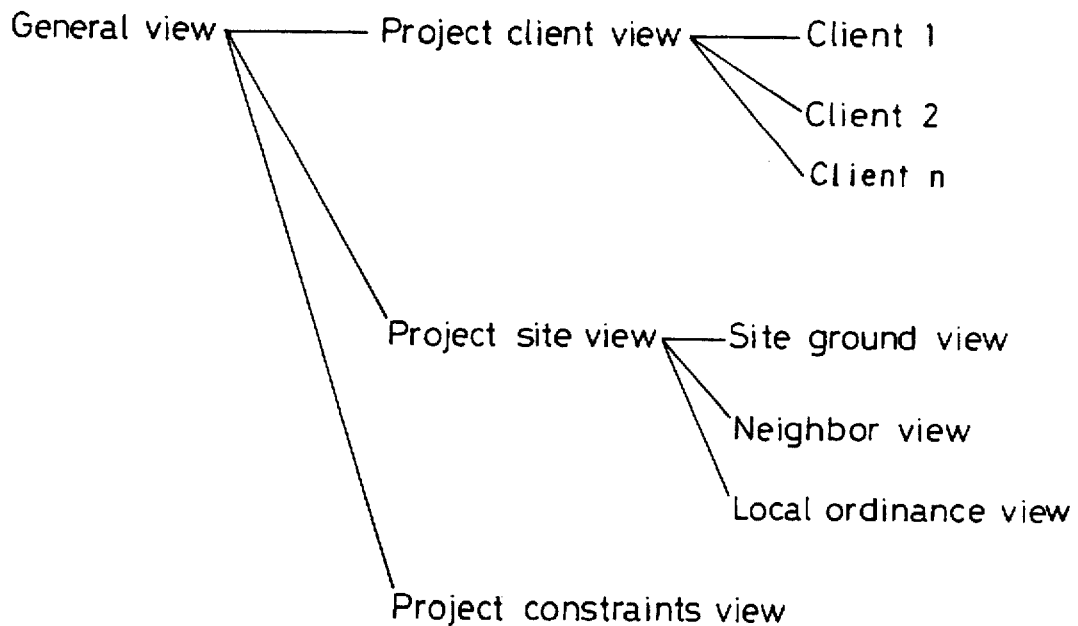

The global view comprises a group of pieces of information about general trends such as a social view, a cost view, and a labor view. Among such views, for example, the cost view includes a total cost view and a detailed cost view as a lower-level information, and the detailed cost view also has a finished or completed cost view and other views as lower-level information, as shown in FIG. 3(a).

The project view has a management view, a general view, a planning view, a sales view, etc., each of which is defined as an object view. Further, these views have various views that are properly defined as lower-level information, as shown in FIGS. 3(a) through 3(g). Thus, the system is arranged such that persons who are engaged in various activities perform their respective activities from their own vantage points along the process flow of the construction.

Figure 3B:
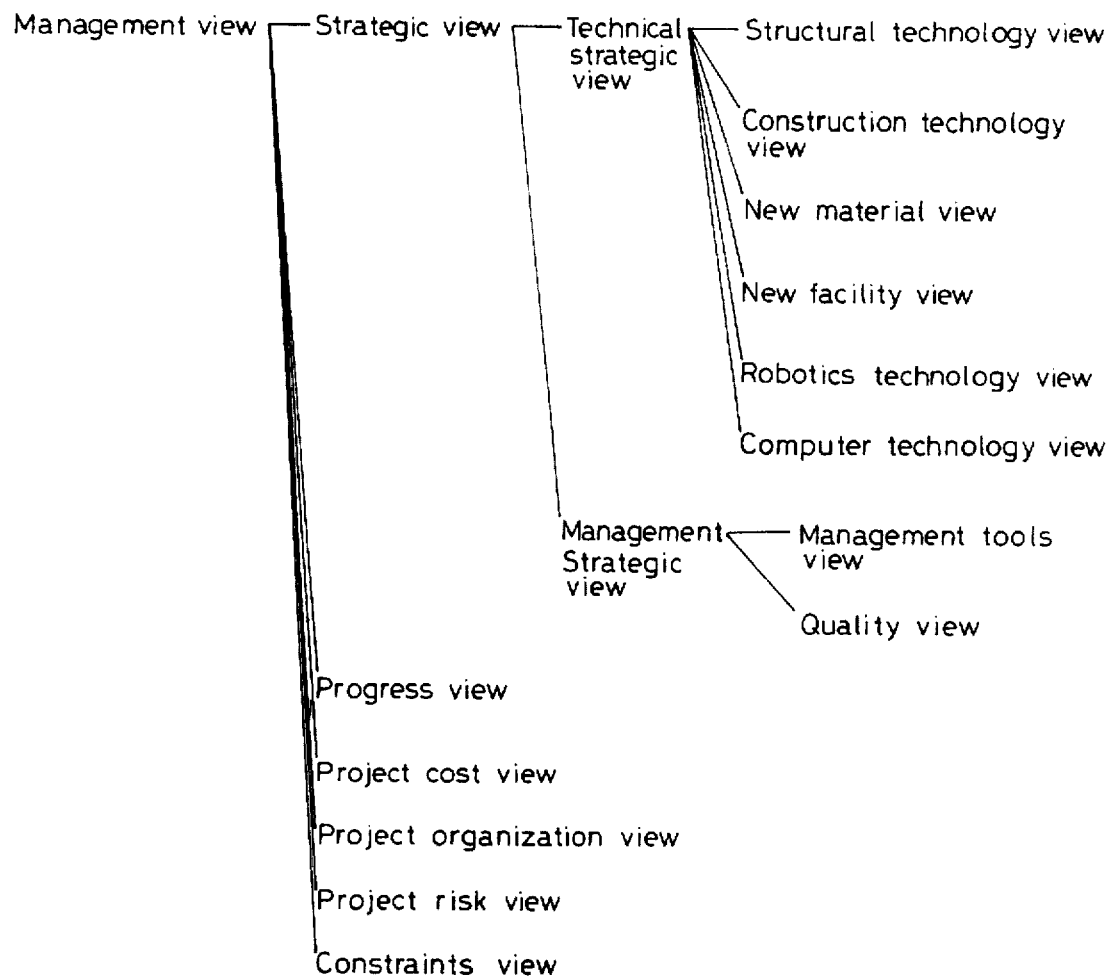
Figure 3D:
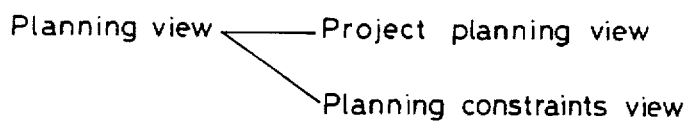
Figure 3E:
Figure 3F:
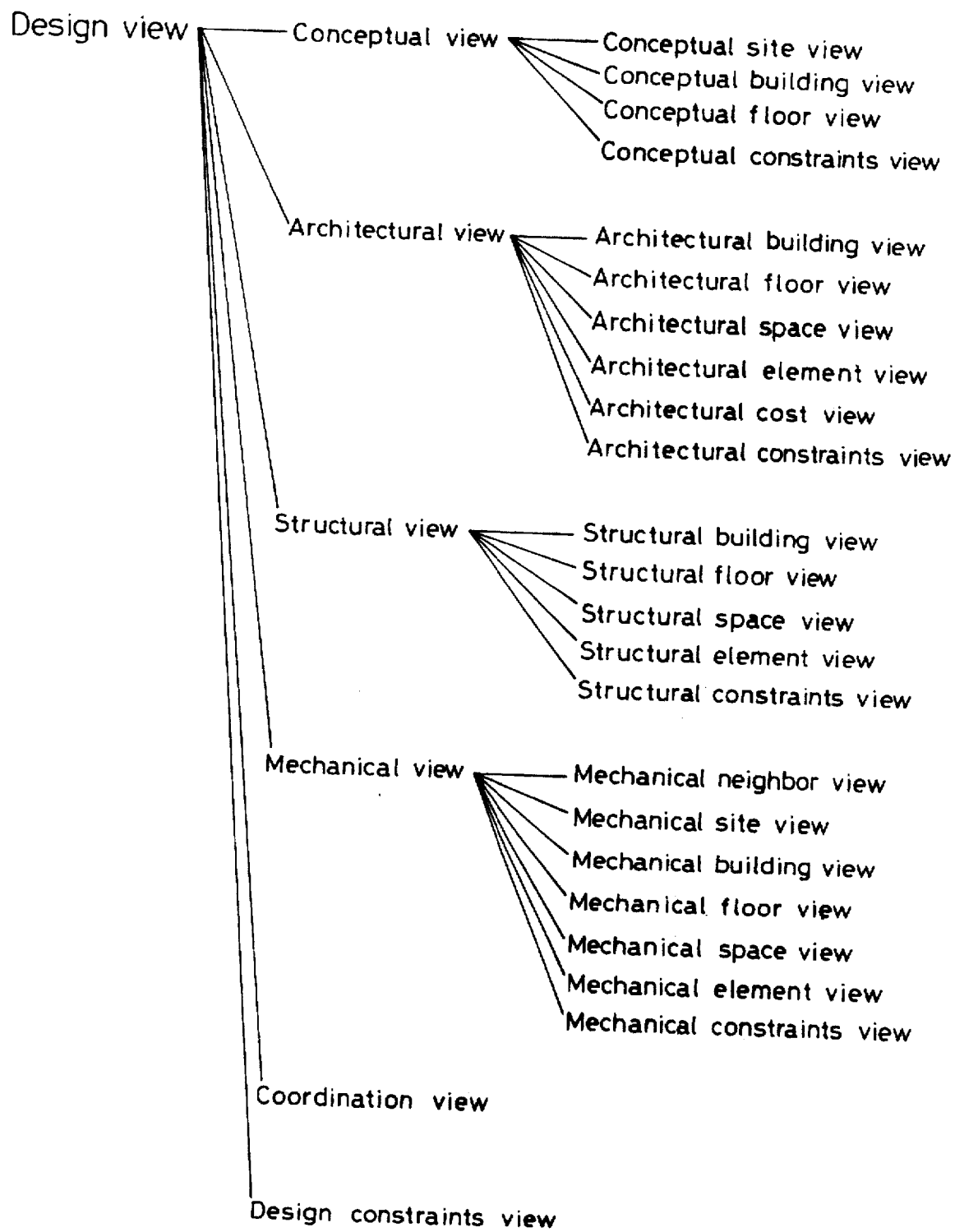
Figure 3G:
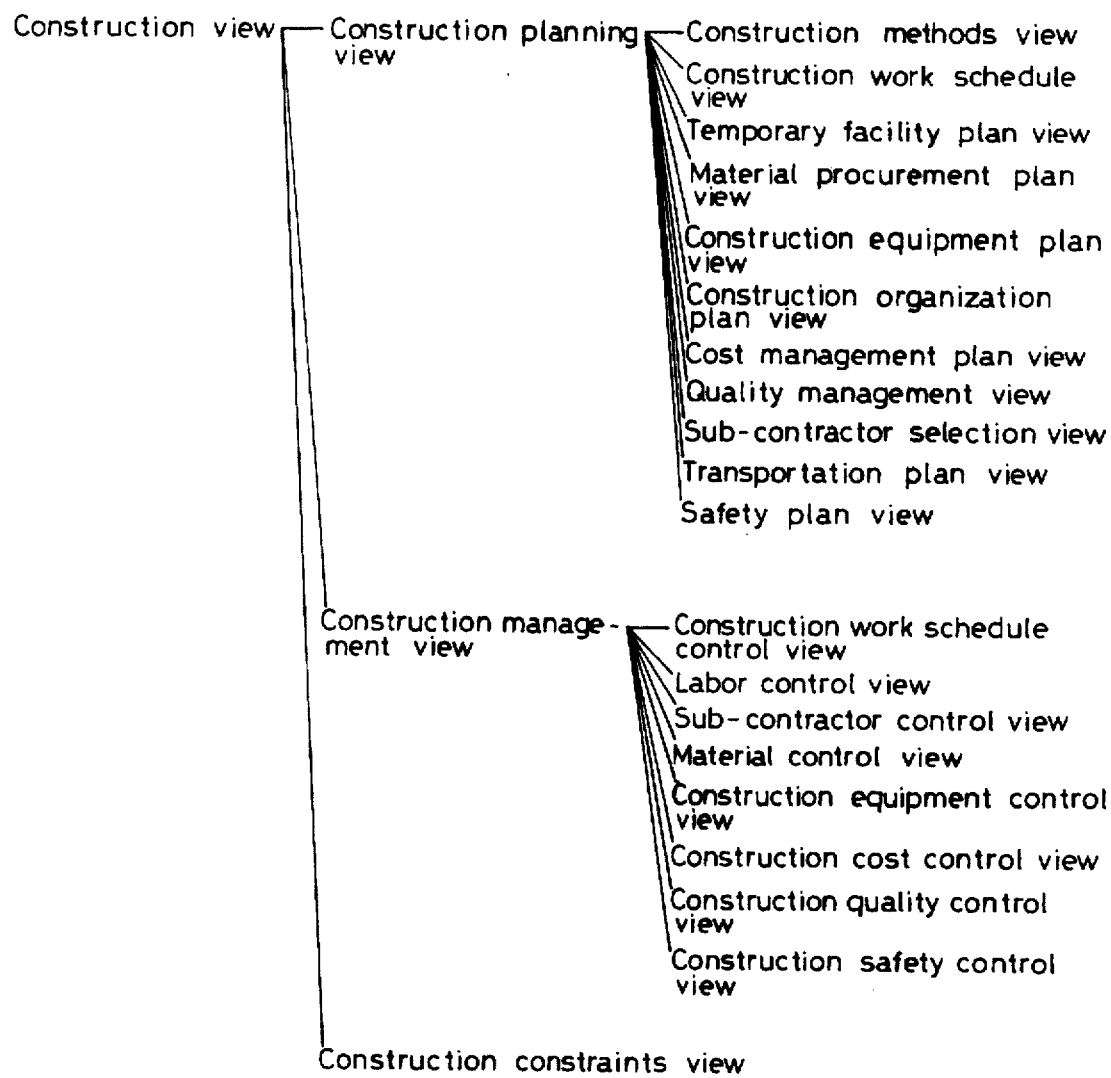
Figure 3H:
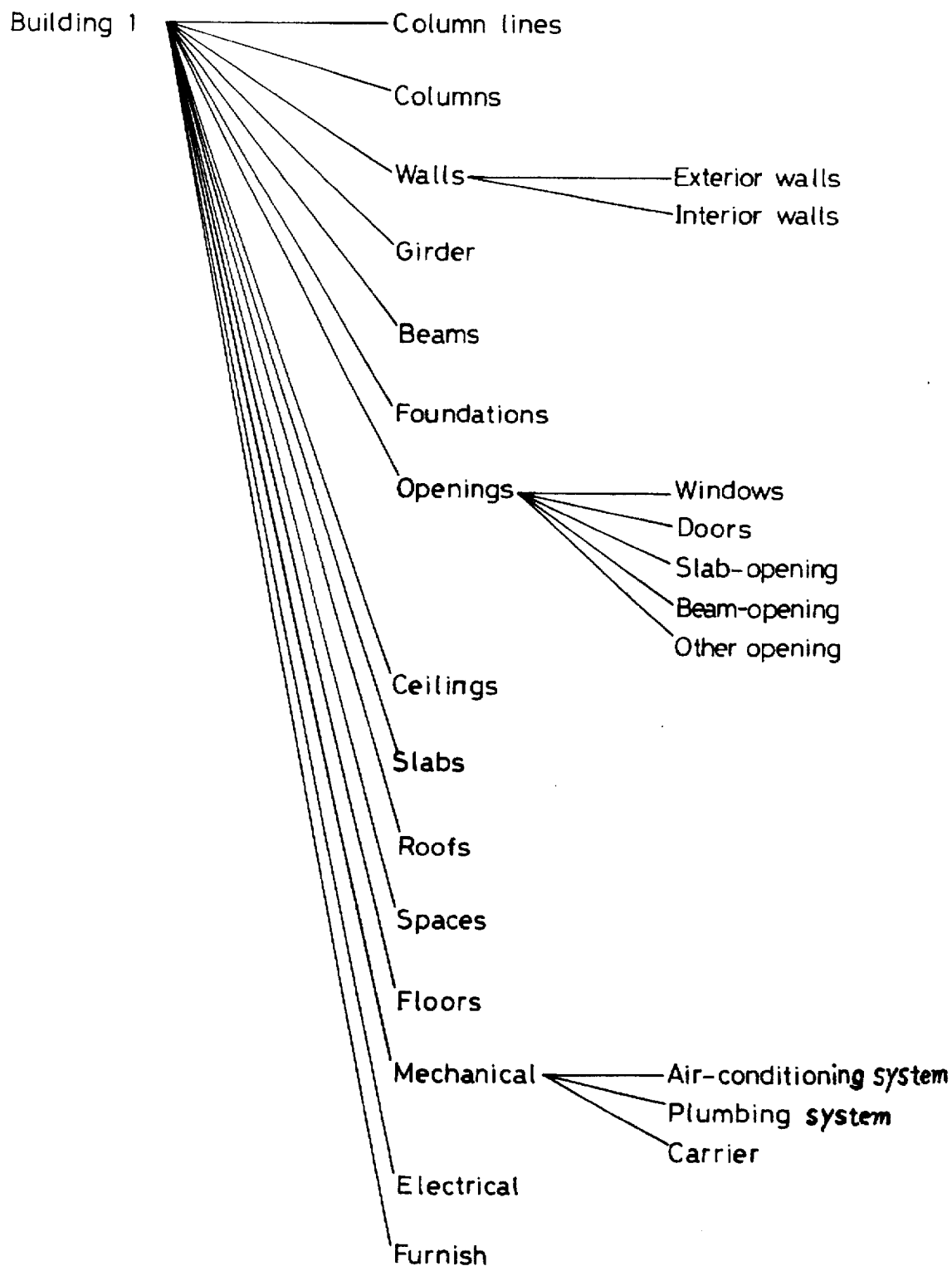

In the object view (i.e., a product model in the project model that represents a building itself), columns, walls, girders, etc. are defined under the names of Building 1 and Building 2, as shown in FIG. 3(h). Thus, the object view contains information in conformance with each individual project.

Views are viewpoints which are each defined as objects along the flow of productive activities in the process model. For example, the management view is a project manager's viewpoint, which is defined as one object based on such viewpoint, and various views may be derived from this object, as shown in FIG. 3(b). More specifically, from the project manager's viewpoint or standpoint, the progress of the project may be strategically considered. Accordingly, views (i.e., a strategic view, a progress view, a project cost view, a project organization view and a project risk view) are presented as sub-views (i.e., lower-level information). Similarly, the general view, the planning view, the sales view, the design view and the construction view have sub-views which are represented from the respective viewpoints, as shown in FIG. 3(c), FIG. 3(d), FIG. 3(e), FIG. 3(f) and FIG.(g).

There are situations where a plurality of buildings are constructed with one project, and there are also situations where a plurality of plans must be made for construction of one building. For this reason, the system is arranged such that a plurality of sets of data items for a product model can be prepared. The necessary data is prepared by using the above-described create object view in accordance with the progress of the project. For example, the construction view includes viewpoints of construction planning view and construction work schedule control. The construction planning includes, for example, viewpoints of construction methods and construction work schedule. Thus, while the project progresses, the data changes, and the evaluation thereof also changes. In the case of the construction view, such view is divided into a construction planning view and a construction work schedule control view; and a hierarchical structure is formed under each of these views, as shown in FIG. 3(g). Thus, views associated with the construction planning and work schedule control activities are prepared, but some of such views may not be used in an actual project. When an activity other than those included in these views is to be executed, the user can create a new object view by defining a combination of data from which the user wants to see the actual data according to the uses of the subject building. Such function is the above-described create object view, and is a significant function for creating a new object.

The term "product model" is actually used in the manufacturing industry when a product is processed as a model in a computer. That is, a final product that is process as a model in a three-dimensional data structure is a computer is called a "product model". In the present invention, a building is represented by using the concept of a product model in the same way as in the manufacturing industry; and the building production process (i.e., the flow of activities from sales to conceptual design, estimation and construction) is represented by using the concept of a process model as a kind of production activity model, as described above.

More specifically, the product model is formed in a computer modeling of the building by using the representation of elements (e.g., columns and girders), while the process model is defined by using various views in which the person in charge (i.e., a chief designer, an architect, a structural engineer or the like) considers an actual building.

The arrangement of views and access to the views is hereinafter explained by way of specific examples.

Figure 4A:
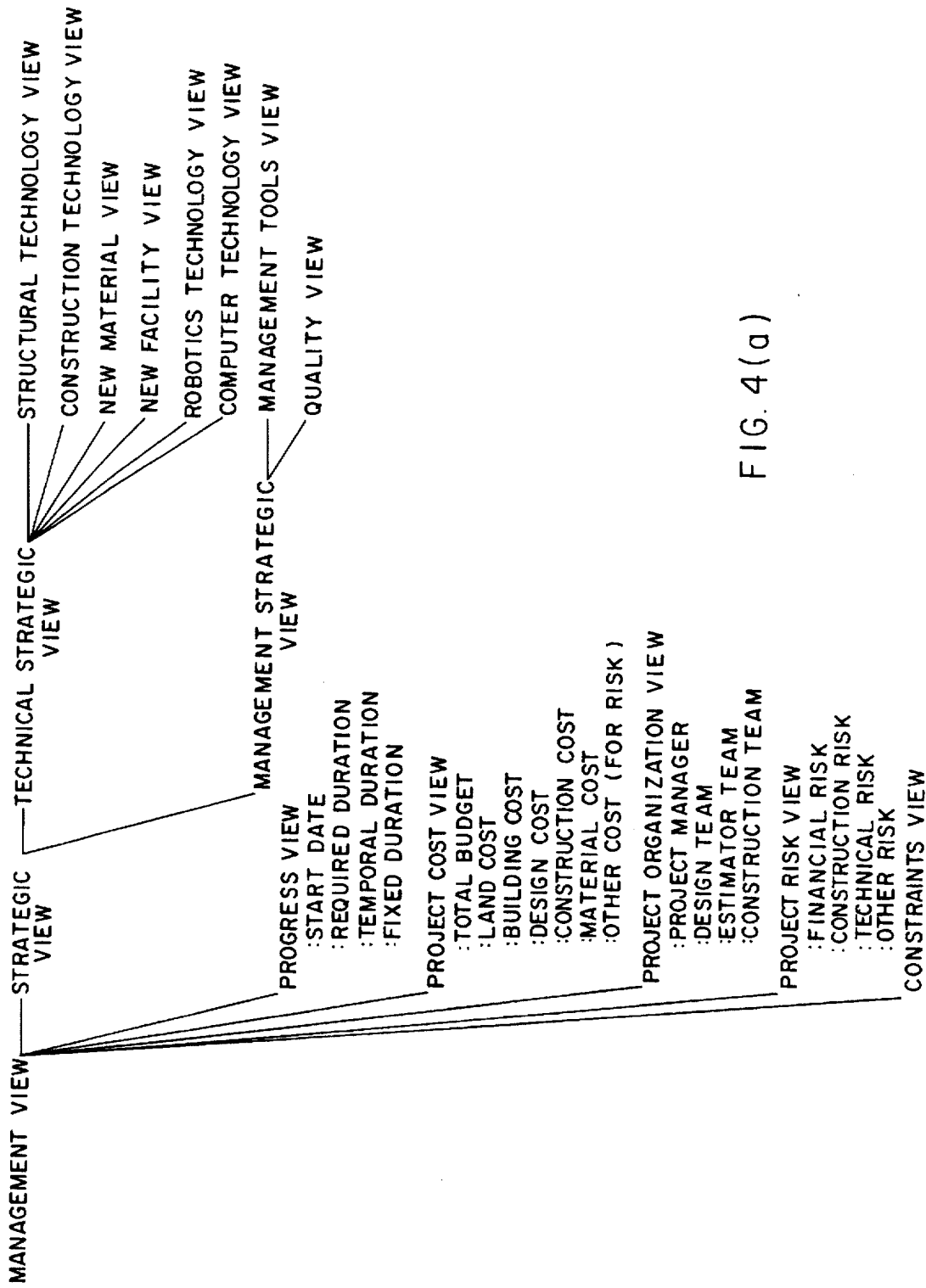
FIGS. 4(a) through 4(c) show specific examples of the arrangements of a management view and a general view, as well as examples of constraint inheritance relationships.

The hierarchical structure of the management view, which has been described above with reference to FIG. 3(b), will be explained more specifically. For example, the management view contains a strategic view, a progress view, a project cost view, a project organization view, a project risk view and a constraints view, as shown in FIG. 4(a). Further, a technical strategic view and a management strategic view are provided under the strategic view. The technical strategic view contains a structural technology view, a construction technology view, a new material view, a new facility view, a robotics technology view, and a computer technology view. The progress view contains information on a construction period requested by a client in the middle of an evaluation made at the stage of conceptual design, and information on a construction period that is fixed by making a construction plan at the stage where the design is completed and construction is to be started. A value associated with the information is placed in the slot or data item in the form of a function. Thus, information as to which data and rule are to be used for evaluation at each stage of the progress is properly embedded in the view in the form of a function. The progress view has items and values associated therewith, but has no lower-level views. Such is the same in the case of the project cost view.

The project cost view contains data items (i.e., total budget, land cost, building cost, design cost, construction cost, material cost, and other cost) which are arranged so that such items are associated or interfaced with each other.

As described above, intermediate views are sub-objects which have slots and data, and also have lower-level information. There are views which have no slots or data items, but the last view has slots or data items. When the project is specified, such view is referred to from other evaluation items, and the evaluation system is activated in order to decide which item is employed in the project.

Figure 4B:
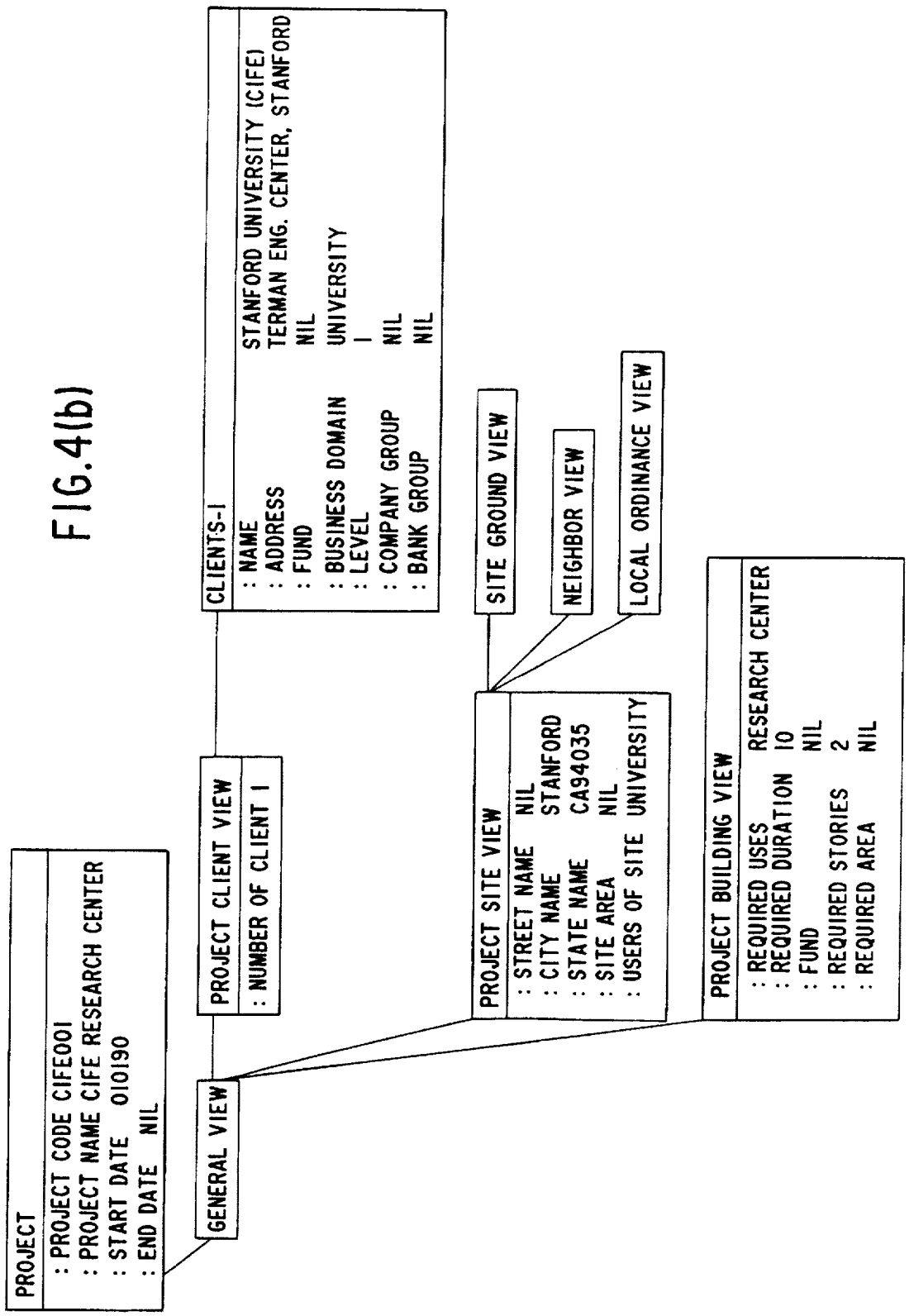

In the project view, the project code, the project name, the start date, and the end date are written, as shown in FIG. 4(b). The project view has a general view as one of the lower-level views; and a project client view is provided under the general view. In the project client view, for example, the number of clients is placed (i.e., if there are a plurality of clients, the number 2, 3, 4 ... n is placed). The number of pieces of lower-level information is determined in correspondence with the number of clients; and when the number is determined, the information is automatically prepared. For example, if there is only one client, the project client view has only one piece of lower-level information as client information; whereas, if there are three clients, the project client view has three distinct pieces of lower-level information about the clients. This function is also imparted to the object. Similarly, the project site view contains site information, and further has a site ground view, a neighbor view, and a local ordinate view as lower-level information.

Figure 4C:
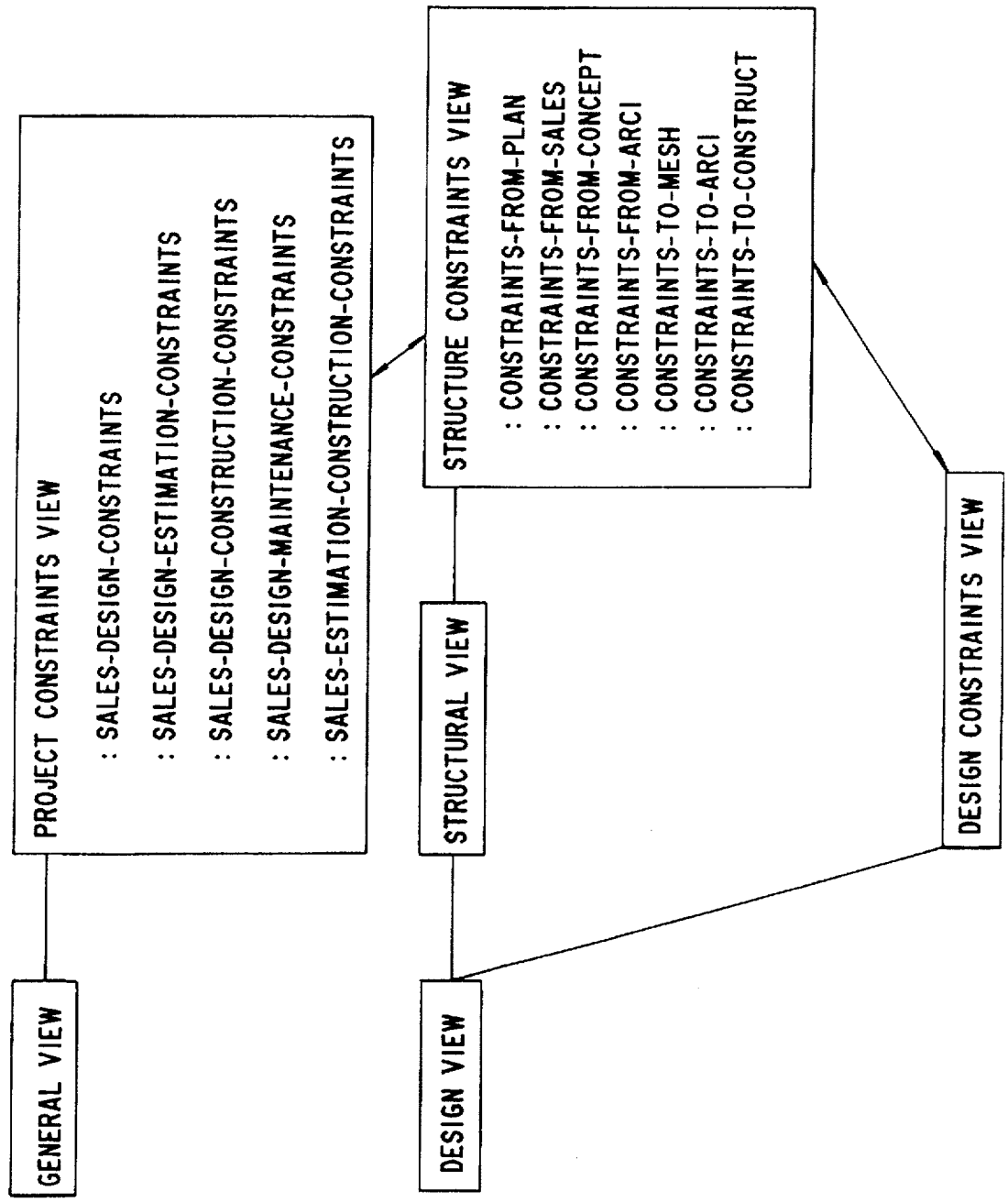

As to constraints, for example, the structure constraints view has a value in the slot or data item so as to provide access to a higher-level view (i.e., the project constraints view under the general view, the design constraints view under the design view, etc.), as shown in FIG. 4(c).

Thus, the general view contains project constraints, and if such constraints are inherited; and, for example, a site and a client are decided on, constraints on design are created. In other words, as the design progresses on the basis of constraints, constraints on the construction are created one after another on the basis of the contents of the design. For example, if the work at a certain place cannot be completed within the set time for completion or the cost is exceeded, the project must be redone. In such a case, because there is provided a project constraints view, information about the way in which constrains are related to building production activities from sales to design, estimation and construction (e.g., sales-design-estimation-construction-constraints) can be placed as a slot value, which is delivered in the model which manages the constraints. For example, the design view contains a conceptual view, an architectural view, a structural view, a mechanical view, an electrical view, a view for coordination of all such views, and a view for coordinating of contending views, and constraints are propagated from each higher level to the next lower level.

Next, the manner or process in which a user has access to the system will hereinafter be explained.

In the integrated construction project information management system of the present invention, the project model is composed of a process model formed by providing in the computer model the flow of construction activities and a product model formed by providing in such model constituent elements of a building. Accordingly, each user can readily execute his own activity and retrieve necessary information concerned with other activities. It is also possible to readily effect a security control for the model. Therefore, a right to access is set by the system for each user.

Figures 5A, 5B:
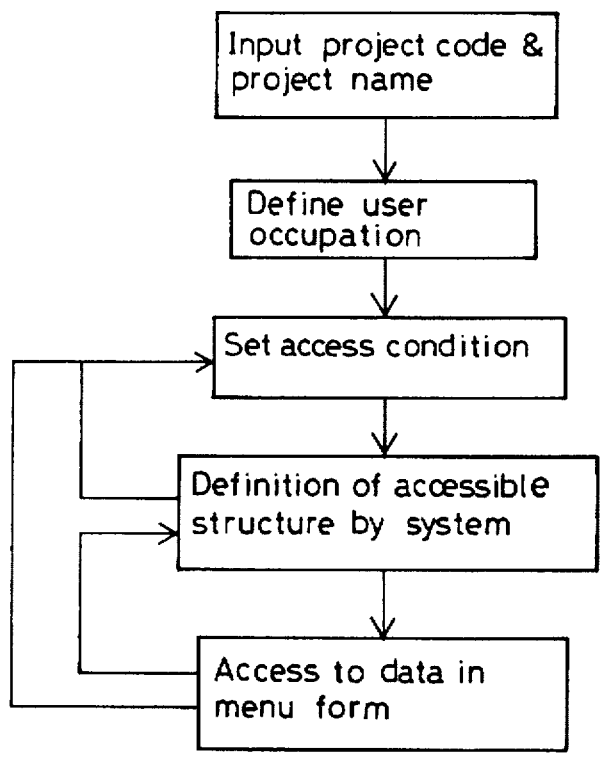
FIGS. 5(a) and 5(b) show a flow diagram of a building model, including the process of a user's right of access.

In order to have access to the system, a user first inputs a project code and a project name, as shown at (a) in FIG. 5, and then defines his occupation (e.g., "project manager") from the frame such as that shown at (b) in FIG. 5. Then, the user sets an access condition (i.e., either for reference alone or for rewriting (updating)). Upon completion of the setting of an access condition, the system defines an accessible structure according to the access condition and presents accessible data. Thus, the user is allowed to have access to data in the form of a menu (e.g., direct data processing, data processing by the inheritance of attributes, data processing by various applications, data processing by various expert systems, and the use of the database).

The user's right of access in the reference mode is, for example, defined in the following manner. A project manager can access all the views presented under the project. A sales person can access all the views presented under the global view, the management view, the general view and the sales view. A chief designer can access all the views presented under the global view, the general view and the design view. An estimator can access all the views presented under the general view and the estimation view. A construction manager can access all the views presented under the construction view. A maintenance manager can access all the views presented under the maintenance view. A client can access some of the global, management and general views and all the views presented under the facility management view.

The user's right of access in the updating mode is, for example, defined, in the following manner. A project manager can access all the views presented under the project, while a sales person can access all the views presented under the management view, the general view and the sales view. A chief designer can access all the views presented under the design view, while an estimator can access all the views presented under the construction view. A maintenance manager can access all the views presented under the maintenance view.

A view in the model which the user can enter from the user interface is described by using a function of the view list. For example, a sales person can add information obtained by the sales personnel, but cannot directly modify the contents of the design. In actual practice, the user can retrieve the desired information (e.g., information on the positions of columns and other units of information) by using a graphic interface. The information is represented by a hierarchial structure. However, information that can be accessed by a sales person and information that can be accessed by a designer are different in the hierarchical structure.

A hierarchical structure that can be accessed by each user is held in the program. In the process model, a new object is added for each project. Since the hierarchical structure of the model itself may change, the program is rewritten each time the hierarchical structure changes or a chain is internally held in the model for this purpose. Since each object is interrelated to objects which are created thereunder, when a user is given a right of access to one object, such user can access any object thereunder. However, a provision within the program has been provided so that the user cannot access an object on a higher level.

The access is executed in units of views. For a special object, the user is given a right of access by which the user can see the contents of a view, but cannot touch or manipulate such contents. In such a case, when a new view is created, the program gives the user a right of access by which the user can only enter the view and read the contents. More particularly, a new view can be created only under an accessible object, and this view is accessible by the user who created it.

If a user has his own application, it can be accessed by preparing an interface therefor. In the relationship with the user interface, access is allowed from the interface of the application, and a view from which it can be accessed is regulated. In addition, it is possible to change data in the model from each interface, and retrieve data for processing. Also, it is possible to perform integrated communication using a certain view.

Accordingly, when declaring his position or occupation, the user is given an accessible view from the system. For example, a sales person can see the management view and the general view, and can also enter in a sales view, and thereafter rewrite information which is essential for his use.

Thus, when the user inputs his position in the project, (i.e., a project manager, a sales person or a designer), the extent to which the user can access views in the hierarchical structure is decided by his position on the project. More specifically, in the present invention, the system is considered not merely a database, but one project model. Therefore, a right of access by which a specific user can access a specific portion of the model is provided in the form of an interface. This is one of the roles performed by the interface with respect to the user in the model. Accordingly, when the user's standpoint is defined, the system evaluates and provides the information where the user can enter.

In addition, if a designer defines data concerned with a project by using CAD, a product model in the project model can be automatically formed with information obtained from CAD. An interface therefore is also restrictively provided for CAD. Other applications also have their own interfaces. For example, even a simple system for estimating has an interface as long as it is a system concerned with sales information. By obtaining data through such interfaces, the model increases as the project progresses; and data related to the project is stored. When a person in charge wants to see information given at a later stage, all the information can be drawn from the model. Thus, all information concerned with the project is unitarily or cumulatively managed by this model.

The sub-model for applications can also be used for a construction planning aid system, a finish estimation system, and some other expert systems. The model externally obtains data, and also provides data to other applications. Interfaces for the applications are all held in the model. Accordingly, as the number of applications increases, interfaces thereof are added or contained in the applications; thereby, allowing the model to expand. Information on the unit cost of finish, construction achievements, etc. can be obtained through the interface between the model and the database.

The starting of an application by a function is effected in the following manner. If the user can enter and access a certain view, a function embedded therein is automatically activated. In this case, an instruction has been set for the function to be activated when it is to be seen. Accordingly, the function is activated to evaluate other data and provide the user with the value obtained.

For example, if an externally defined application is available for the calculation of a roughly estimated construction period, when a certain user enters the view for the rough estimation of a construction period and proceed to see the function, the application can be automatically activated to allow the user to see the result of the calculation of a roughly estimated construction period. In this case, some applications are embedded in the model in the form of function names and are defined such that if the user enters under certain conditions, the applications can be activated. Some applications are defined such that they are activated on the basis of the relationship between the model and the user. Each application is activated within the limits defined by the function in the model. Such applications not only can be activated from the model, but can also be activated independently, as a matter of course.

Figure 6A:
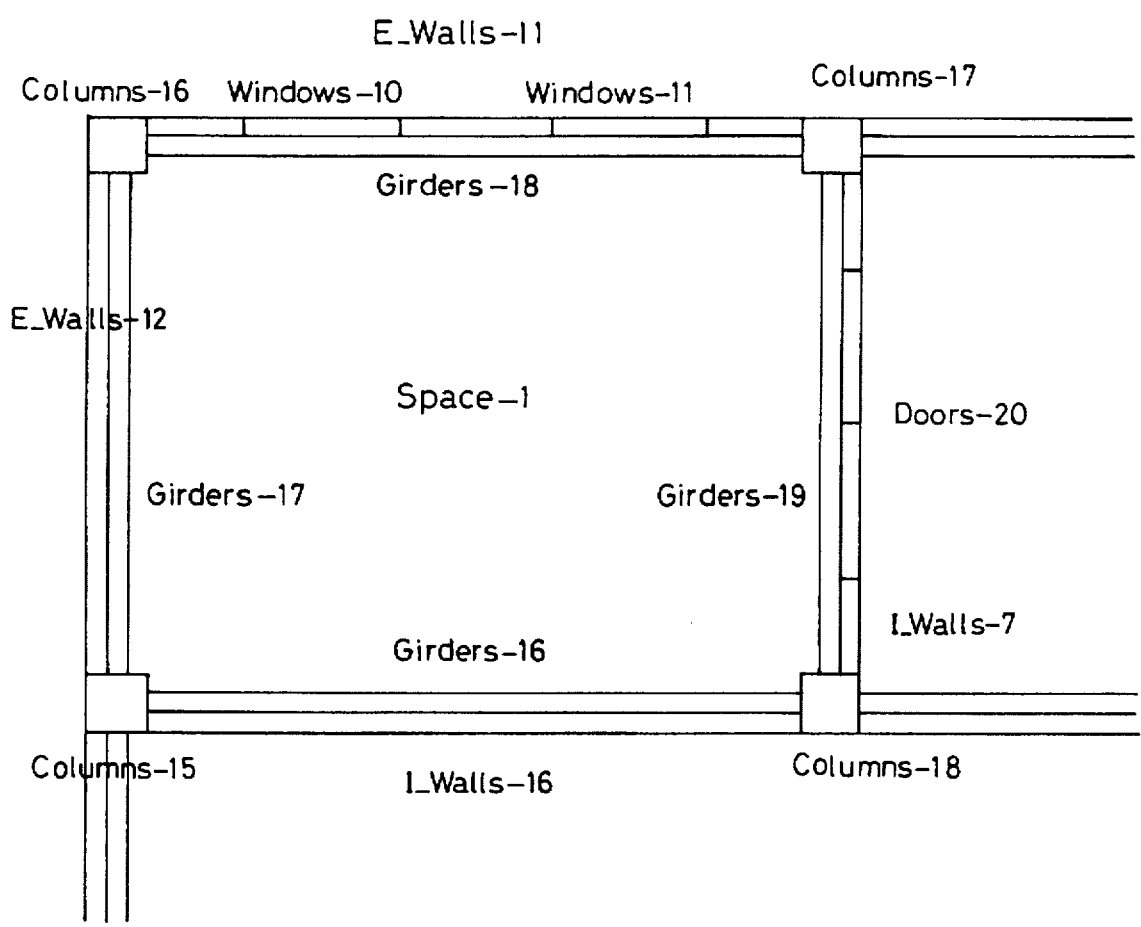
FIG. 6(a) shows a plan view of a building.

Next, an example of an arrangement of access paths will hereinafter be explained. In the case of a building (such as, the building shown in plan view of FIG. 6(a)), descriptions on the usage of the building, location and client, are made, as shown in FIG. 6(b). With regard to the structure, there are the following descriptions: (1) the underground is SRC; (2) the superstructure is RC; (3) the building has four stories above ground and one beneath ground level; and (4) the ground condition is good. With regard to the floors, the second floor is described as follows: (1) it is used as an office, (2) the floor area is 1,400 square ft., and (3) the structure is RC. The room is described as consisting of two exterior walls, two interior walls, four columns, four girders, one slab, two windows and one door. There are also descriptions of the respective sizes of these constituent elements.

Figure 6C:
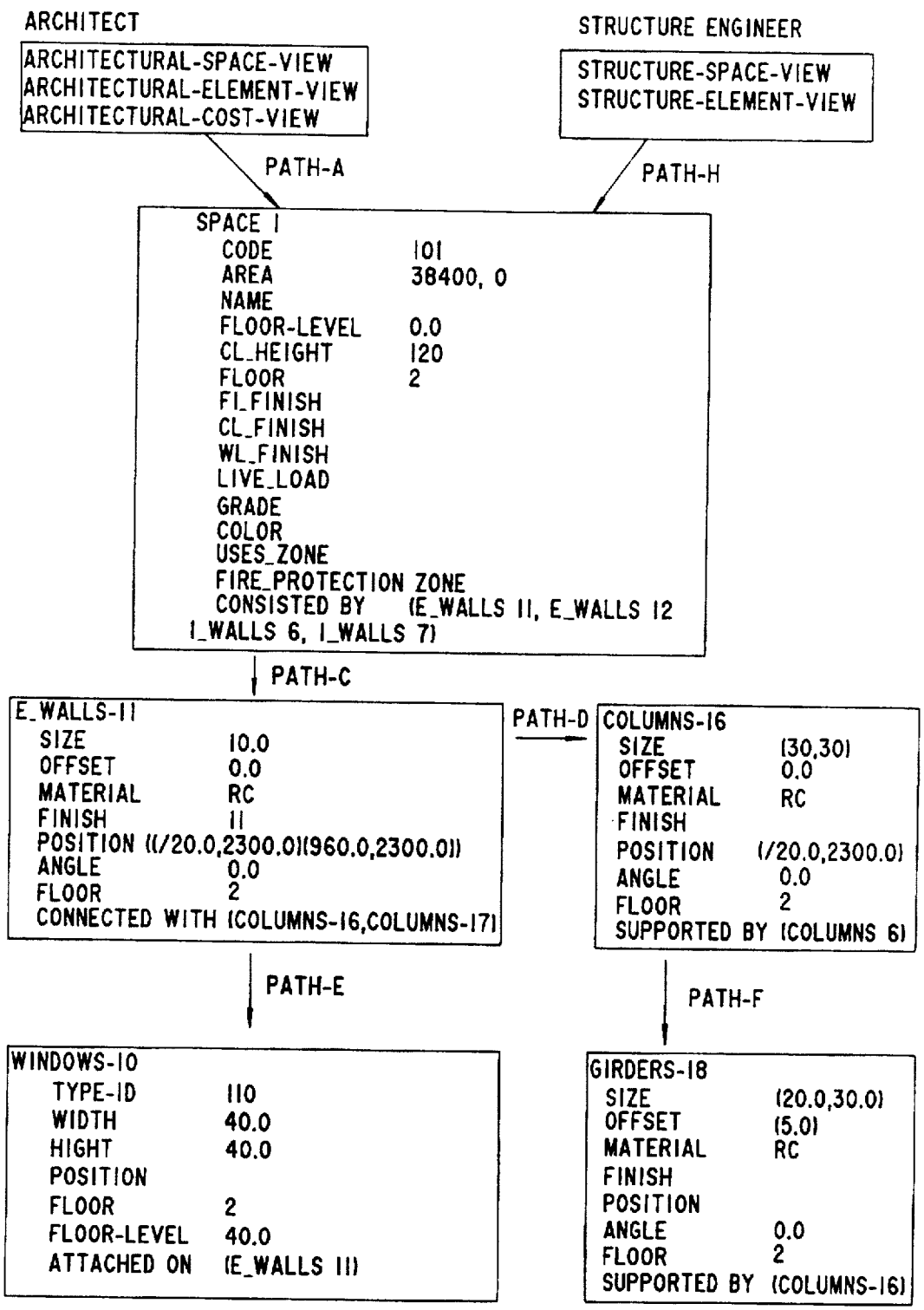
FIG. 6(c) shows examples of paths for access by an architect and a structural engineer.

When an architect wants to see, for example, architectural information, he first obtains and sees information on the room, and from the information "Room", the architect can reach information "Walls", and then information "Windows", as shown in FIG. 6(c). Although it is possible to directly access the information "Windows", when it cannot be specified, the user can reach the information "Windows" from the object of "Room" through the information "Walls". A structural engineer can go to the information "Walls" from the object "Room" and then follow a path to structural information "Girders" supported by information "Columns", which is connected to the information "Walls", to see the information about girders.

Thus, the access paths differ according to the user's intended usage for various activities in the project. This is because access paths are automatically set when the user declares his position in the project or occupation in the user interface for entry, and defines a view which the user wants to see. For example, if the user defines himself as a structural engineer and enters the structural design view in the design view and then further enters the structural space view, slots or data items which can be seen through predetermined paths have been prepared. Accordingly, if the user defines himself as a structural engineer in the user interface, he can enter the view on the user interface program and see the desired data by following paths defined in the view.

For example, in the illustrated view "Space", four walls are defined as "Consisted by", and information on columns and girders are drawn from the information "Walls". In addition, items that show the connecting relationship are provided so that information about columns and girders can be automatically drawn out. Thus, unitary or cumulative management of information is performed for each individual building project, and it is therefore possible for all users to obtain the desired information at any time and in the desired form.

The following is a description on the manner in which the model of the present invention is constructed along the flow of productive activities, and the manner in which the model is used by each person in charge.

(a) Definition of a project by the project leader (a project code, a project name, etc.).

(b) Input of a client name by the sales person (an embedded function is automatically activated to fetch the necessary information from a client information database in the relational database and stores it in the model).

(c) Input of site information by the sales person (an embedded function is automatically activated to fetch the necessary information from a city information database in the relational database and stores it in the model).

(d) Input of the client's needs by the sales person (e.g., the usage of the building, construction period, cost, etc.).

(e) An embedded function is automatically activated in order to evaluate the income and expenditure concerned with the project and others.

(f) Evaluation of the project by the project leader using the existing information (e.g., decision on the general plan of the project, selection of adoptable construction methods, materials, etc., and the setting of a roughly estimated construction period). Such pieces of information are respectively stored in objects and used by various persons in charge.

(g) Proposal to the client by the sales person by using, for example, a building usage selection system.

(h) Selection of project members by using projection information and personnel information.

(i) Construction of a product model by the architect using rough design (using a, e.g., CAD system) and design information.

(j) Evaluation of the roughly estimated construction period and cost by using the design information.

(k) Planning, preliminary design (using CAD) and updating of the product model by the architect, structural and mechanical engineers.

(l) Utilization of the product model by the estimator.

(m) Selection of a construction method and evaluation of the construction period, cost, etc. by the construction manager using the product model and the information about adoptable construction methods (the evaluated information is stored in the process model, and various proposals are made to the designer by using the model).

(n) Preparation of a working drawing and updating of the product model by referring to the proposals made by, e.g., the construction manager. Distribution of information from the product model to various CAD systems including a working drawing CAD system.

(o) Estimation and construction planning at an early stage.

Other activities include, e.g., the making of a detailed plan for field work and preparation of a sub-model that can be utilized at the construction site, preparation of a sub-model for usage and maintenance, and comprehensive evaluation of the project by using the building model. Thus, the project model is expanded along with the flow of the project, and it is contained and used as a project database jointly by various persons engaged in the building production. In the building production, the project model not only functions merely as a place where information is delivered, but also incorporates various functions and rules.

Next, the features of the process model is explained hereinafter.

In the process model, the flow of productive activities (i.e., planning, sales, design, estimation, construction, usage and maintenance), and each person's activities are defined as objects which hold necessary information, and manner in which the subject building is evaluated in each productive activity. It is therefore possible to keep the product model independent of the process, and operate, in a flexible manner, with changes in the contents of the productive activities and changes in the project organization, as well as with the changes in the system.

According to the conventional studies of product models, information necessary for each person's activity, relationship, procedures, etc. are all stored in a product model. Therefore, it is difficult to set a product model in itself, and it is likely that the product model information will be improperly distributed to specific activity domains so that it may be necessary to change the structure of the product model in accordance with changes in the contents of the activities or in the system.

In contrast, the process model of the present invention enables the product model to be kept independent of the process (i.e., the flow or process of building production). Accordingly, the design of a product model is facilitated, and it is possible to construct a product model that covers a wide area of productive activities. In addition, changes in the contents of activities, the project organization or the system are processed at the process model side, and the product model is not substantially affected.

In this invention, it is also possible to store client information, site neighborhood information, cost information, etc. in the product model.

In addition, since not only objects along the flow of production activities, but also views such as a management view for management of the whole project and a general view for storage of project information are defined in the project model, even more extensive information can be represented or provided. For example, information on the progress of the project and information on the project cost, risk, etc. are defined in sub-views in the management view, and such pieces of information can be referred to from various activities according to need.

When an integrated project database is considered, it is necessary to provide each person in charge with the maximum amount of information, while not jeopardizing the security of the information. In the present invention, these requirements are met by the operation of the system in which it presents a top-level view which can be referred to or updated by the user on the screen by confirming the user's position or occupation and access mode.

For example, a sales person can access the social view, the management view, the general view, the planning view and the sales view; and retrieve information therein in the retrieval mode, but in the updating mode such sales person can access only the sales view and the general view. In the system of the present invention, such a restriction is placed on all the persons in charge of the project; thereby, enabling information protection and management.

Each object that is defined as a process model can have data, various kinds of function, system rule, etc. as the contents thereof. Such function enables each individual person in charge to take out or obtain information necessary for his activity from the product model or objects for other persons in charge and use it for his own activity.

In addition, the functions and rules defined in each object enable the user to change a relationship defined in an object in the product model as desired in conformance with his own purpose.

For example, columns and girders are represented by the relationship "Supported" in the product model. When a structural engineer uses this information, the relationship between columns and girders need not be changed, but such relationship is not appropriate for a construction manager. Therefore, when a construction manager uses the information, he defines the relationship "Supported" as the relationship "After"; thereby, making it possible to obtain the information that girder work comes after the work on columns that support girders. If information on building production is represented only by a product model without using a process model, all the possible relationships among building elements must be described in the product model.

Thus, it is possible to construct a system that enables building production to be highly advanced and integrated beyond the framework which has heretofore been imposed by considering information on a building itself as a product model and the flow of building production activities as a process model; and realizing a project model on a computer by making use of object-oriented representation.

In design planning, it is necessary to provide cooperative design in which an architect, and structural and mechanical engineers share the same design information with each other with each one working on his own design, while taking into consideration the others' design activities (i.e., sharing of information at the horizontal level). In construction planning, it is important to examine a construction method plan, temporary facility plan, and progress schedule at each of the outline, preliminary and detailed planning stages on the basis of constraints provided through the project model as the design planning progresses, and allow the results of these examinations to be reflected in the design planning through the model (i.e., sharing of information at the vertical level). It is also significant to set management information used at the construction management stage.

For example, when an architect designs a building, he considers the floor area, span, actual usage and so forth of each floor at the conceptual design stage. However, at the stage of preliminary design or working drawing, the designer considers the interior finish color of each room and the interior finish itself. In the present invention, employment of cooperative engineering activities enables a construction manager to evaluate the construction plan from his own view or vantage point based on information that shows the present progress of design, and the determined design information at the stage where the designer is working on. Accordingly, it is possible to shorten the lead time between design and construction and similarly reduces work for all concerned.

Figure 7:
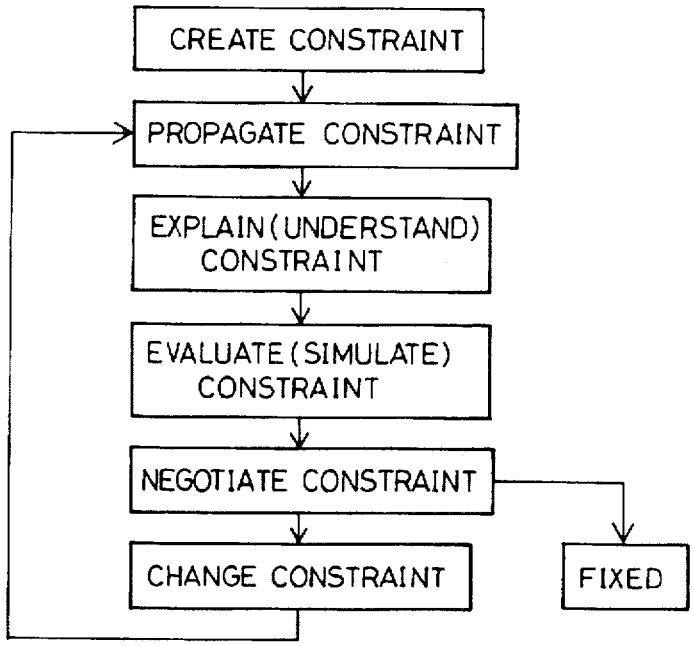
FIG. 7 shows an example of a constraint transition cycle.

The model consequently has a large amount of data required, but the data that is provided is completely different depending upon the position or occupation of the person who works with the model, and the time when he enters. In the building process, a large number of pieces of information are created and defined as constraints which affect activities carried out at the later stages of the production process. The transition cycle of a constraint takes place as shown in FIG. 7 in the following manner:

Create Propagate→a Explain (Understand) →Evaluate→Negotiate→Change

It has, prior to this invention, been extremely difficult to represent this cycle on a computer.

In the model of the present invention, constraints themselves are defined as objects and provided with the function of inheriting information along the flow of the process; thereby, providing the following steps in the above-described cycle.

Propagate and Explain (Understand) Constraint

For example, in actual activities, various kinds of construction methods are, in many cases, examined, evaluated and decided on by a structural designer based on site conditions, the usage of the building and other conditions. Such pieces of information are represented in various drawings and specification, and transmitted to an estimator and a construction manager. Accordingly, when a problem occurs, the construction manager may find such task troublesome because a great deal of time is essential to vary the design due to a large amount of rework.

In contrast, according to the present invention, when the structural designer evaluates construction methods by using an expert system embedded in his view, information resulting from the evaluation is stored in the design constraints view (object) for transmission of the information from the structural designer to other persons in charge. Thus, the information is transmitted to the estimation view and the construction view.

Accordingly, if the estimator or the construction manager enters his own view, it is possible to know the names of the construction methods (i.e., propagating function). Further, it is possible to know the reason why the structural designer decided on the construction methods by using the embedded function. It is also possible for the estimator or the construction manager to change some constraints in the view to thereby execute re-evaluation from his standpoint (i.e., explaining-understanding function).

Figure 8:
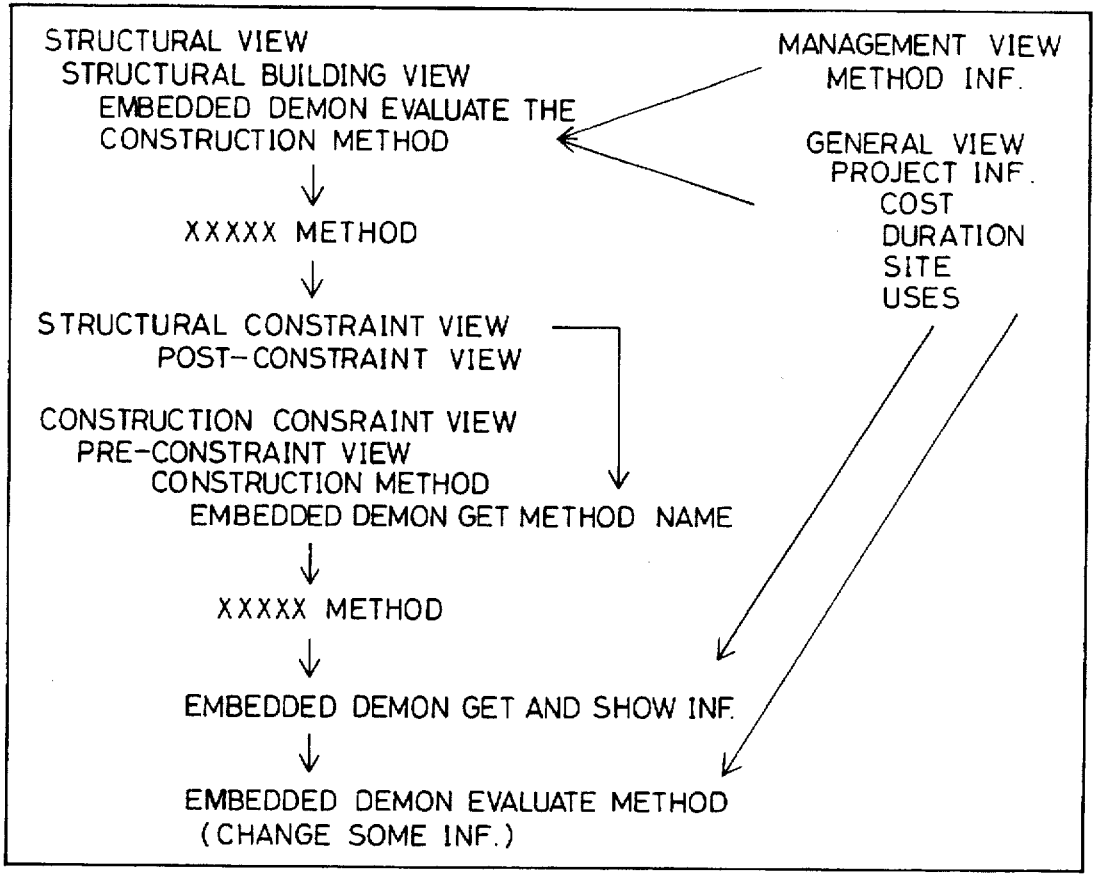
FIG. 8 shows a process flow which is executed for varying a design.

At this time, if the construction manager finds a better construction method, he returns the name of the new construction method to the structural engineer by using the constraint propagating function, as shown in FIG. 8; thereby, enabling examination of the variation of design at an early stage. This constraint management function enables realization of an even more substantial cooperative design-construction planning environment using the model of the present invention.

Thus, the model of the present invention contains all the information on a project of the construction of a building, and further has all the data for providing information necessary for each person's activities. Thus, it is possible to provide a system convenient to the user. In addition, since a person at a later stage in the process can see the information concerned with a person at an earlier stage, it is possible to integrate design and construction with each other and also integrate activities related to design and construction. Thus, significant advantages and benefits are attained.

It should be noted that the present invention is not necessarily limited to the above-described embodiments, and that various changes and modifications may be imparted thereto.

For example, although in the described embodiment the present invention is applied to a building, the invention can be similarly applied to large-scale products other than buildings (e.g., plants, vessels, etc.). Further, the present invention can be similarly applied to any products as long as models can be constructed from constituent parts and from the viewpoints of productive activities; such as, a product model and a process model (e.g., production systems and research and development systems), in addition to the above-described products.

Accordingly, the terms "production" and "product" employed in the detailed description of the present invention include the above-described concepts or structural arrangements.

As will be clear from the foregoing description, according to the present invention, information about a building itself is considered to be a product model, while the flow of the building production activities is considered to be a process model, and a project model is provided in a computer by using object-oriented representation. Accordingly, it is possible to provide an integrated, unitary or cumulative management of information in building production, highly-advanced building production, and integration of building production. Further, the project model of the present invention is effectively utilized to provide cooperative design-construction planning necessary for building production activities which are expected to become even more diversified and complicated in the future. The integrated system that utilizes the project model enables management, propagation, control and relaxation of various constraints which are created at an earlier stage in building production and effect the later stages thereof. In the process model, the flow of productive activities (i.e., planning, sales, design, estimation, construction, usage, maintenance, etc.), and each person's activities are defined as objects which contain necessary information and information on the manner in which the building is evaluated in each productive activity. Accordingly, it is possible to keep the product model's independent, and yet flexibly operate with changes in the contents of the productive activities and in the project organization, along with changes in the system.

What I claim is:

1. An integrated construction project information management system, comprising:

a project model having: (a) a product model that defines a product by physical elements and functional elements, and (b) a process model that defines activities related to the product, said process model having elements which are described as hierarchical objects along the flow of productive activities, wherein said productive activities include at least one of planning, sales, design, estimation, construction, usage and maintenance, wherein said hierarchical objects are designated activities for at least first and second sets of users for estimating each of said productive activities, said first set of users having a higher hierarchical ordering than said second set of users;

means for interfacing between said project model, and systems other than said project model and a database; and means for interfacing with said project model by users, wherein said hierarchical objects, arranged along the flow of said productive activities, are different for and are accessible to different users of said system, wherein said means for interfacing controls accessibility and interfaceability of said users to said hierarchical objects, and wherein said means for interfacing controls access and interface of said first set of users so as to be capable of at least one of accessing and interfacing with the same hierarchical objects accessible to and interfacing with said second set of users.

2. An integrated construction project information management system according to claim 1, wherein said objects include a data object that includes data, a scope view object that contains a function for viewing, an evaluate view object for evaluating another object, and a create view object for creating a new object.

3. An integrated construction project information management system according to claim 1, wherein said process model includes information necessary for execution of said activities, wherein said process model further includes an information reference method, in the form of values of slots or data items, for fetching necessary information from the data in said product model and applications actually related to said activities.

4. An integrated construction project information management system according to claim 1, wherein said process model includes a constraint view that has a value for inheriting a constraint to another view in a slot or data item and a function for explaining the reason for decision of the constraint propagated.

5. An integrated construction project information management system according to claim 1, wherein a view access right is provided as a function of a list so that it is possible to access lower-level views in the form of view units.

6. An integrated construction project information management system according to claim 1, wherein an application is contained in a slot or data item in the form of a function so that an operation of said application can be started by said function.

7. An integrated construction project information management system according to claim 1, wherein said process model further includes a management view for managing a project, and a general view for storing project information.

8. An integrated construction project information management system, comprising:

a project model having: (a) a product model that defines a product by physical elements and functional elements, and (b) a process model that defines activities related to the product, said process model having elements which are described as hierarchical objects along the flow of productive activities, wherein said hierarchical objects are designated for at least first and second sets of users, said first set of users having a higher hierarchical ordering than said second set of users;

means for interfacing between said project model, and systems other than said project model and a database; and means for interfacing with said project model by users, wherein said hierarchical objects, arranged along the flow of said productive activities, are different for and are accessible to different users of said system, wherein said means for interfacing controls accessibility and interfaceability of said users to said hierarchical objects, said interfaceability being a cycle to create, propagate, explain or understand, evaluate, negotiate and change, and wherein said means for interfacing controls access and interface of said first set of users so as to be capable of at least one of accessing and interfacing with the same hierarchical objects accessible to and interfacing with said second set of users.

* * * * *